United States Patent [19]
Yahiro et al.

[11] Patent Number: 5,661,078
[45] Date of Patent: Aug. 26, 1997

[54] METHOD OF MANUFACTURING A SEMICONDUCTOR DEVICE HAVING A WIRING FORMED BY SILVER BROMIDE

[75] Inventors: Kazuyuki Yahiro, Kawasaki; Shuji Itonaga, Kitakyushu, both of Japan

[73] Assignee: Kabushiki Kaisha Toshiba, Kawasaki, Japan

[21] Appl. No.: 449,674

[22] Filed: May 24, 1995

Related U.S. Application Data

[62] Division of Ser. No. 371,126, Jan. 11, 1995, abandoned.

[30] Foreign Application Priority Data

Jan. 20, 1994 [JP] Japan ................. 6-004735

[51] Int. Cl.⁶ ................. H01L 21/268; H01L 21/283
[52] U.S. Cl. ................. 438/660; 437/188; 438/686
[58] Field of Search ................. 437/187, 189, 437/195, 188, 174; 257/762

[56] References Cited

U.S. PATENT DOCUMENTS

| | | | |
|---|---|---|---|
| 4,425,196 | 1/1984 | Bessette et al. | 204/15 |
| 4,661,214 | 4/1987 | Young | 204/15 |
| 5,043,244 | 8/1991 | Cairncross et al. | 430/247 |
| 5,301,349 | 4/1994 | Nakata et al. | 395/800 |
| 5,384,230 | 1/1995 | Berg | 430/313 |

FOREIGN PATENT DOCUMENTS 0094789 7/1981 Japan ................. 257/762

OTHER PUBLICATIONS

Wolf, Silicon Processing, vol. 2, 1990, Lattice Press, pp. 101–111.

IBMTDB, Pressman et al., Silver Metallurgy for Semiconductor Device, vol. 13, No. 5, Oct. 1970 pp. 1118–1119.

*Primary Examiner*—T. N. Quach
*Attorney, Agent, or Firm*—Finnegan, Henderson, Farabow, Garrett & Dunner, L.L.P.

[57] ABSTRACT

In a semiconductor device according to the present invention, a diffusion layer is formed on a silicon substrate, and a Silicon oxide film is deposited thereon. A hole communicating with the diffusion layer is formed in the silicon oxide film. A silver bromide emulsion is applied to the silicon oxide film having the hole by the spin coat technique. The silver bromide emulsion is irradiated with light through a mask to leave only that portion of the emulsion which is exposed by the light. By doing so, a metal wiring is formed integrally with a via hole, and thus decreased in resistance and suitable for forming the via hole. Consequently, a semiconductor device having such a wiring can be obtained easily, inexpensively.

3 Claims, 3 Drawing Sheets

FIG. 2
(PRIOR ART)

- FORMATION OF DIFFUSION LAYER
- DEPOSITION OF SiO$_2$ FILM
- VIA HOLE PEP
- VIA HOLE RIE
- W CVD
- DEPOSITION OF Aℓ FILM
- Aℓ FILM PEP
- Aℓ FILM RIE

FIG. 4

- FORMATION OF DIFFUSION LAYER
- DEPOSITION OF SiO$_2$ FILM
- (VIA) HOLE PEP
- (VIA) HOLE RIE
- SILVER BROMIDE PEP
- LASER ANNEAL

METHOD OF MANUFACTURING A SEMICONDUCTOR DEVICE HAVING A WIRING FORMED BY SILVER BROMIDE

This is a division of application Ser. No. 08/371,126, filed Jan. 11, 1995 abandoned.

BACKGROUND OF THE INVENTION

1. Field of the Invention

The present invention relates to a semiconductor device having a wiring formed by silver bromide and a method of manufacturing the same and, more specifically, to a method of manufacturing a semiconductor device capable of easily, inexpensively forming a low-resistance wiring suitable for filling a via hole.

2. Description of the Related Art

FIGS. 1A to 1E show a process of manufacturing a semiconductor device wherein a diffusion layer formed on a silicon (Si) substrate and a metal wiring formed on a silicon oxide ($SiO_2$) film are connected to each other through a via hole.

First a diffusion layer 2 is formed by diffusing impurities from the surface of a Si substrate 1, and then a $SiO_2$ film 3 is deposited on the Si substrate 1 (FIG. 1A). Employing the PEP (Photo Engraving Process) and RIE (Reactive Ion Etching), a hole 4 is formed in the $SiO_2$ film 3 so as to communicate with the diffusion layer 2 (FIG. 1B). The hole 4 is filled with a metallic material such as tungsten (W) by the CVD (Chemical vapor Deposition), resulting in a via hole 5 (FIG. 1C). After that, a wiring material such as aluminum (Al) is deposited on the $SiO_2$ film 3 in which the via hole 5 is formed, thereby to form a wiring layer 6 (FIG. 1D). The wiring layer 6 is processed by the PEP and RIE to form a metal wiring 7 having a predetermined pattern (FIG. 1E).

However, the conventional method described above has a drawback of increasing the number of steps of forming the via hole 5 and metal wiring 7 and complicating the process of forming them, as shown in FIG. 2. It also has a drawback of increasing the resistance of the wiring since the tungsten (W) is used for forming the via hole 5 and is therefore unsuitable for forming a via hole having a high aspect ratio. To eliminate these drawbacks, it has been expected to develop a method capable of easily, inexpensively forming a wiring which is low in resistance and suitable for filling a via hole.

SUMMARY OF THE INVENTION

An object of the present invention is to provide a semiconductor device and a method of manufacturing the same, capable of easily, inexpensively forming a low-resistance wiring suitable for filling a via hole.

To attain the above object, according to one aspect of the present invention, there is provided a semiconductor device comprising:

a semiconductor substrate; and a wiring formed on the semiconductor substrate through an insulation film by treating silver bromide emulsion.

According to another aspect of the present invention, there is provided a semiconductor device comprising:

a semiconductor substrate on a surface region of which an active device is formed;

an insulation film formed on the semiconductor substrate;

a hole formed in the insulation film and communicating with the active device; and a wiring formed on the insulation film by filling the hole with part of silver bromide emulsion and treating the silver bromide emulsion.

According to still another aspect of the present invention, there is provided a method of manufacturing a semiconductor device comprising the steps of:

applying a silver bromide emulsion onto a surface of a semiconductor substrate through an insulation film;

exposing the silver bromide emulsion in accordance with a predetermined pattern; and treating the silver bromide emulsion exposed in accordance with the predetermined pattern.

According to another aspect of the present invention, there is provided a method of manufacturing a semiconductor device, comprising the steps of:

providing a desired active device on a semiconductor substrate;

forming an insulation film on the semiconductor substrate including an forming portion of the active device;

forming a hole in the insulation film in accordance with the forming portion of the active device;

applying a silver bromide emulsion onto the insulation film in which the hole is formed;

exposing the silver bromide emulsion in accordance with a predetermined wiring pattern; and treating the silver bromide emulsion exposed in accordance with the wiring pattern, thereby to form a connecting portion integrally with a silver wiring, the connecting portion connecting the silver wiring and the active device to each other.

According to the present invention described above, since a wiring is formed by employing the property of silver bromide in which the bromide is changed to silver by exposure, it is improved in operation speed and saving power and can be obtained at low cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a flowcharted view of the manufacturing process shown in FIGS. 1A to 1E;

FIG. 4 is a flowcharted view of the manufacturing process shown in FIGS. 3A to 3E.

DETAILED DESCRIPTION OF THE PREFERRED EMBODIMENTS

An embodiment of the present invention will now be described, with reference to the accompanying drawings.

FIGS. 3A to 3E schematically show the main process of manufacturing a semiconductor device according to the present invention.

Figure 1A:
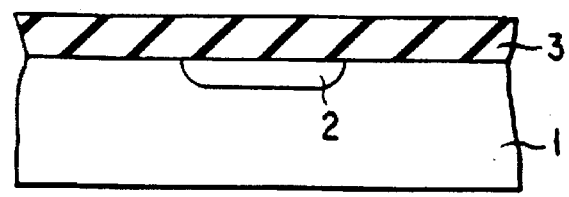
FIGS. 1A to 1E are cross-sectional views of a process of manufacturing a semiconductor device, for explaining the prior art and the drawbacks thereof.
Figure 1B:
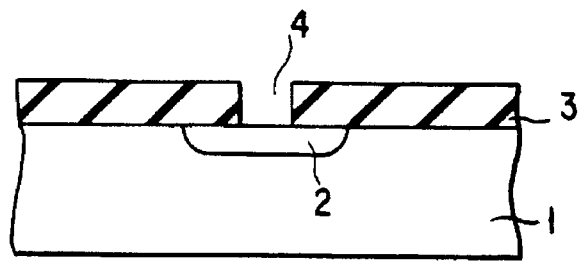
Figure 1C:
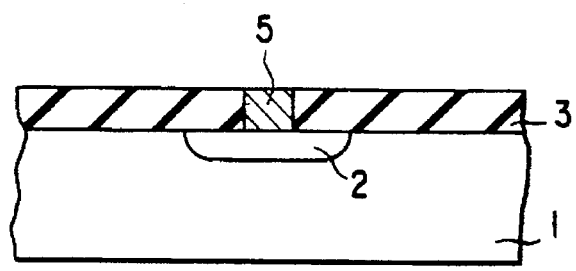
Figure 1D:
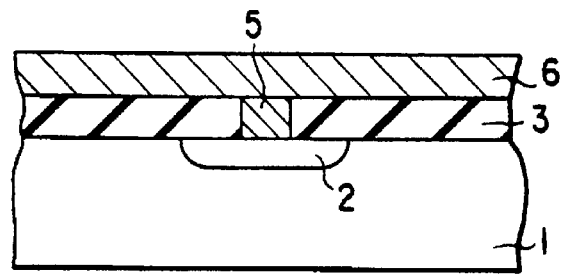
Figure 1E:
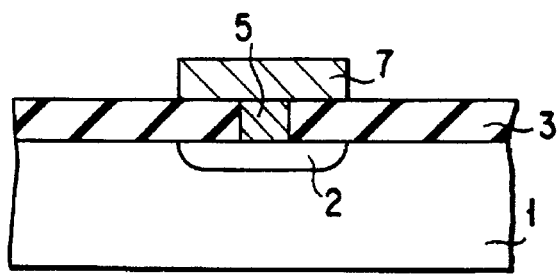
Figure 3A:
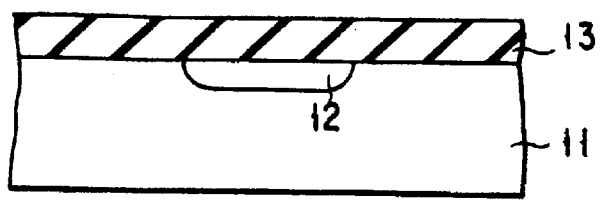
FIGS. 3A to 3E are cross-sectional views of the main process of manufacturing a semiconductor device according to the present invention.
Figure 3B:
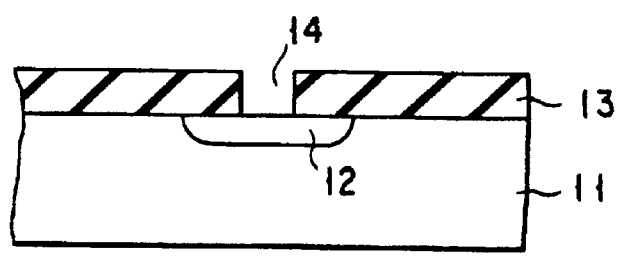
Figure 3C:
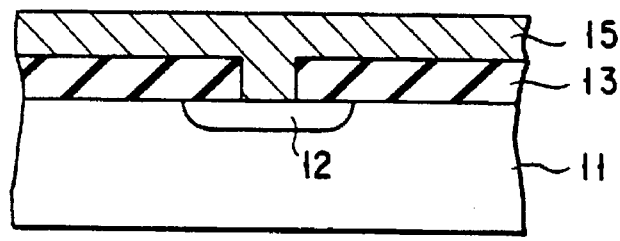

First a diffusion layer 12, serving as an active device, is formed by diffusing impurities from the surface of a Si substrate 11, and then a $SiO_2$ film 13 is deposited on the Si substrate 11 (FIG. 3A). Employing the PEP (Photo Engraving Process) and RIE (Reactive Ion Etching), a hole 14 is formed in the $SiO_2$ film 13 so as to communicate with the diffusion layer 12 (FIG. 3B). The resist remaining on the $SiO_2$ film 13 in which the hole 14 is formed, is removed by ashing, and a silver bromide emulsion 15 is uniformly applied onto the $SiO_2$ film 13 by, e.g., the spin coat technique (FIG. 3C). The emulsion 15 is, for example, a mixture of powdery silver bromide and water solution of gelatin in the ratio of nine to one, and a silver halide emulsion can be used suitably for the emulsion 15.

Figure 3D:
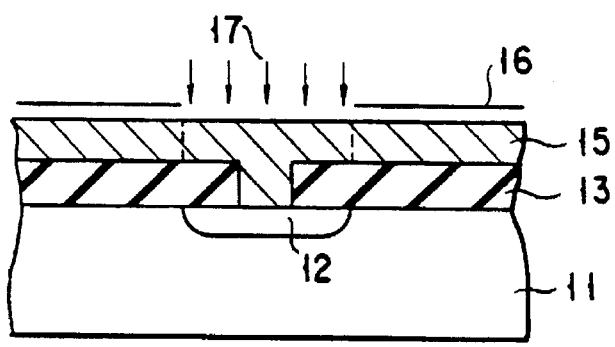

After that, the silver bromide emulsion 15 is exposed and developed (FIG. 3D). The exposure of the emulsion 15 is performed by irradiating the emulsion 15 with light (natural light, etc.) 17 of a specified frequency through a mask 16 having a predetermined wiring pattern according to a position in which the hole 14 is formed. The development of the silver bromide emulsion 15 is performed by using a developer such as hydroquinone. That portion of the emulsion 15 which is exposed by the light 17 remains as a wiring layer of (solid) silver, and the other portion thereof is removed. Subsequently to the development step, a fixing operation for dissolving the portion other than the exposed one, can be carried out when the need arises.

Figure 3E:
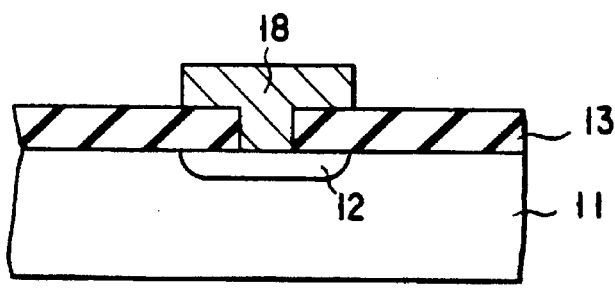

Finally the laser anneal (sinter) treatment is executed at a high temperature of 600° C. to form a metal wiring 18 with which a via hole is formed integrally (FIG. 3E). The metal wiring 18 is connected to the diffusion layer 12 through the via hole. The laser anneal treatment aims at sintering the silver remaining on the Si substrate 11 and eliminating the water solution of gelatin used as the silver bromide emulsion 15, and impurities such as copper (Cu) contained in the water solution.

Since the low-resistance silver is employed to form the wiring and via hole, the wiring is improved in operation speed and saving power. Since, furthermore, the hole 14 is filled with silver by application of the silver bromide emulsion 15, the silver is preferable to tungsten (w) with respect to the filling of the hole 14 in its depth direction, and more applicable for forming a via hole of a high aspect ratio. Moreover, both the wiring and via hole are formed integrally with each other; therefore, the manufacturing process can be greatly shortened and simplified.

As is apparent from FIG. 4, the manufacturing method of the above embodiment does not require the following steps of the prior art method (as shown in FIG. 2): the filling of the hole with tungsten by CVD, deposition of aluminum, PEP of aluminum film, and RIE of aluminum film. In the above embodiment, both the step of PEP of silver bromide and that of laser anneal enable the wiring and via hole to be formed integrally. Consequently, the number of steps can be reduced and the throughput can be improved. Furthermore, since the PEP of silver bromide and the laser anneal are both simple, the yield is also improved.

As described above, the wiring is obtained by employing the property of the silver bromide in which the bromide is changed to silver by exposure and, more specifically, the silver bromide emulsion is applied onto the $SiO_2$ film and then exposed, thus forming a wiring. Since the wiring can thus be formed by using the silver of low-resistance metal, it can be improved in operation speed and saving power. Consequently, low-resistance wiring can be obtained easily, inexpensively.

As described above, since the hole can easily be filled with the silver, a via hole of a high aspect ratio can easily be formed, and a low-resistance wiring suitable for filling of the via hole can be obtained. In particular, the steps of manufacturing a semiconductor device having a wiring and a via hole connected to each other can be greatly decreased in number, since the wiring and via hole can be formed integrally with each other.

The above embodiment is exemplified in the semiconductor device wherein the diffusion layer and the wiring both formed on the Si substrate are connected to each other through the via hole. However, the present invention can be applied to a semiconductor device including an electrode pad constituted of silver or the like. Similarly, it can be applied to a semiconductor device having a multilayer wiring structure and an MCM (Multi Chip Module) incorporating a plurality of devices in a single substrate. It is needless to say that the present invention can be applied to a semiconductor device including a normal wiring (which is not connected to a diffusion layer through a via hole).

Various changes and modifications can be made without departing from the scope of the subject matter of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming an insulation film on a semiconductor substrate having an active device;

forming a hole in said insulation film to expose a forming portion of the active device of said semiconductor substrate;

uniformly applying silver bromide emulsion onto said insulation film to fill the hole;

exposing the silver bromide emulsion to form a wiring pattern; and laser annealing the silver bromide emulsion to integrally form a flat silver wiring corresponding to the wiring pattern and a contact connecting the silver wiring to the active device.

2. The method according to claim 1, wherein said silver bromide emulsion is applied by spin coating.

3. The method according to claim 1 wherein said laser annealing is performed by sintering silver at a temperature of 600° C.

* * * * *